United States Patent
Wang et al.

[11] Patent Number: 6,015,730
[45] Date of Patent: Jan. 18, 2000

[54] INTEGRATION OF SAC AND SALICIDE PROCESSES BY COMBINING HARD MASK AND POLY DEFINITION

[75] Inventors: Chen-Jong Wang; Jenn Ming Huang; Chue San Yoo, all of Hsin-Chu, Taiwan

[73] Assignee: Taiwan Semiconductor Manufacturing Company, Hsin-Chu, Taiwan

[21] Appl. No.: 09/034,926

[22] Filed: Mar. 5, 1998

[51] Int. Cl.$^7$ .................. H01L 21/8242; H01L 21/3205; H01L 21/4763

[52] U.S. Cl. .................. 438/241; 438/258; 438/592; 438/682

[58] Field of Search .................. 438/241, 258, 438/592, 303, 682

[56] References Cited

U.S. PATENT DOCUMENTS

| | | | |
|---|---|---|---|
| 4,997,777 | 3/1991 | Boivin | 438/258 |
| 5,013,674 | 5/1991 | Bergemont | 437/43 |
| 5,094,967 | 3/1992 | Shinada et al. | 437/43 |
| 5,134,083 | 7/1992 | Mathews | 437/40 |
| 5,175,120 | 12/1992 | Lee | 438/201 |
| 5,397,722 | 3/1995 | Bashir et al. | 437/41 |
| 5,472,892 | 12/1995 | Gwen et al. | 438/587 |
| 5,538,912 | 7/1996 | Kunori et al. | 438/201 |
| 5,573,980 | 11/1996 | Yoo | 437/200 |
| 5,668,035 | 9/1997 | Fang et al. | 438/239 |
| 5,668,065 | 9/1997 | Lin | 438/303 |
| 5,719,079 | 2/1998 | Yoo et al. | 438/238 |
| 5,759,889 | 6/1998 | Sakao | 438/241 |
| 5,789,294 | 8/1998 | Choi | 438/258 |
| 5,858,830 | 1/1999 | Yoo et al. | 438/241 |
| 5,858,831 | 1/1999 | Sung | 438/241 |
| 5,863,820 | 1/1999 | Huang | 438/241 |
| 5,866,451 | 2/1999 | Yoo et al. | 438/241 |

*Primary Examiner*—Charles Bowers
*Assistant Examiner*—Robert A. Hullinger
*Attorney, Agent, or Firm*—George O. Saile; Stephen B. Ackerman

[57] ABSTRACT

A process and structure are described wherein logic and memory share the same chip. Contacts to the memory circuits are made using the SAC process, thus ensuring maximum density, while contacts to the logic circuits are made using the SALICIDE process, thus ensuring high performance. The two processes have been integrated within a single chip by first depositing the various layers needed by the gate pedestals in both the logic and the memory areas and then forming the two sets of gate pedestals in separate steps. Gates located in the logic area are formed only from polysilicon while those located in the memory areas also have an overlay of tungsten silicide topped by a hard mask of silicon nitride. With the two sets of gates in place, source/drain regions are formed in the usual way. This includes growing of silicon nitride spacers on the vertical sides of the pedestals. The pedestals in the memory area are much longer than those in the logic area since they extend all the way to the top of the hard masks. The pedestals, on the memory side only, are given a protective coating of oxide (RPO). This allows the SALICIDE process to be selectively applied to only the logic side. Then, while the logic side is protected, the SAC process is applied to the memory side. This process is self-aligning. The long spacers define the contact holes and the hard masks allow oversize openings to be etched without the danger of shorting through to the pedestals.

15 Claims, 3 Drawing Sheets

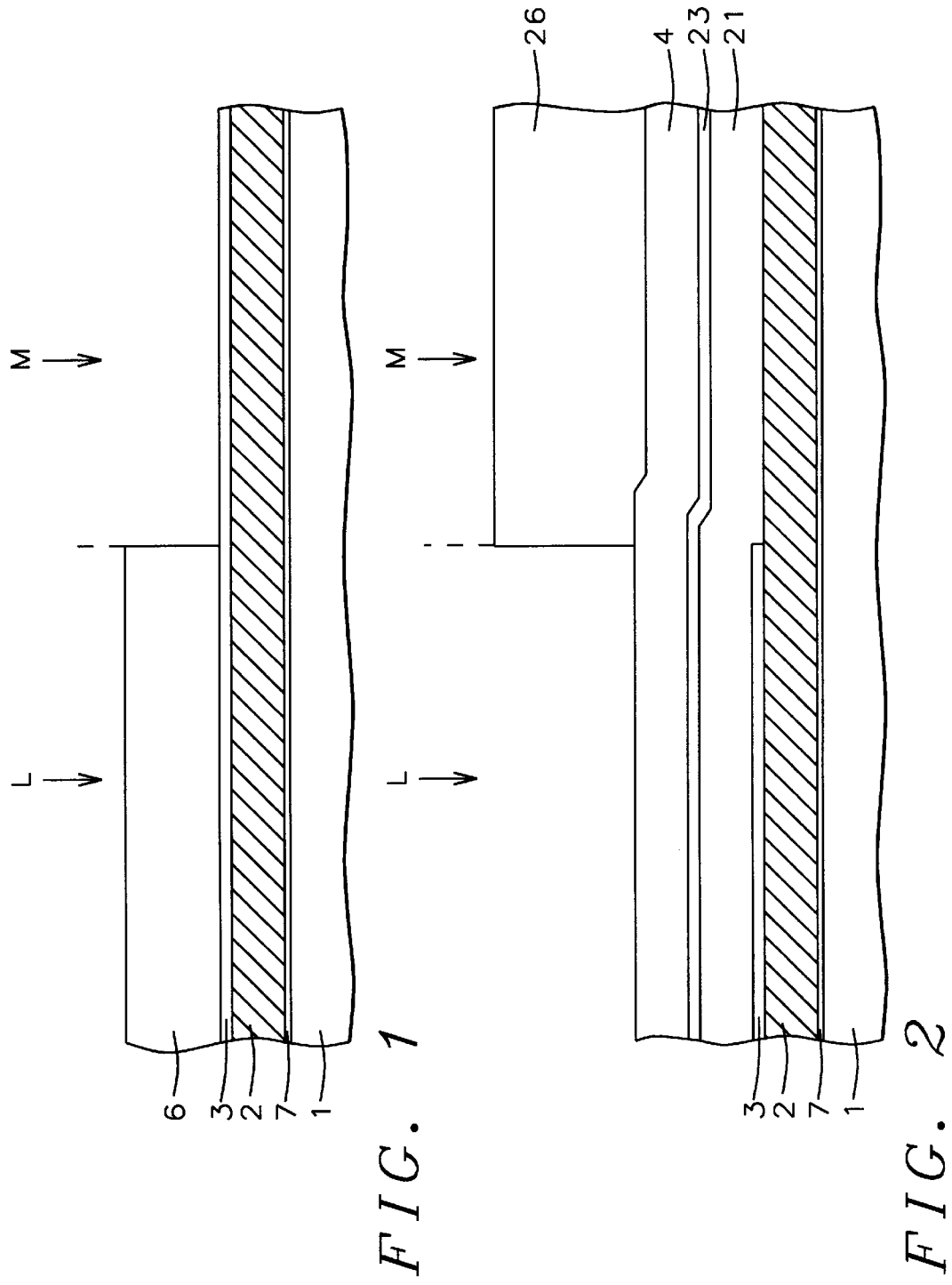

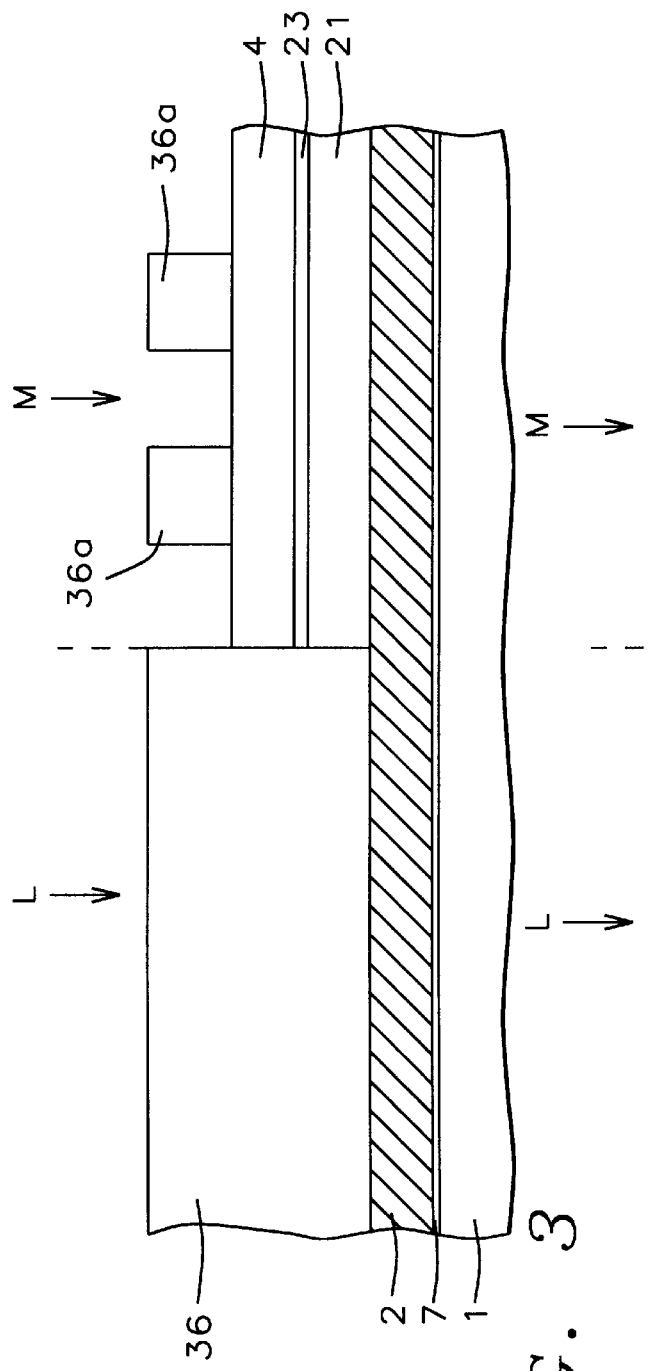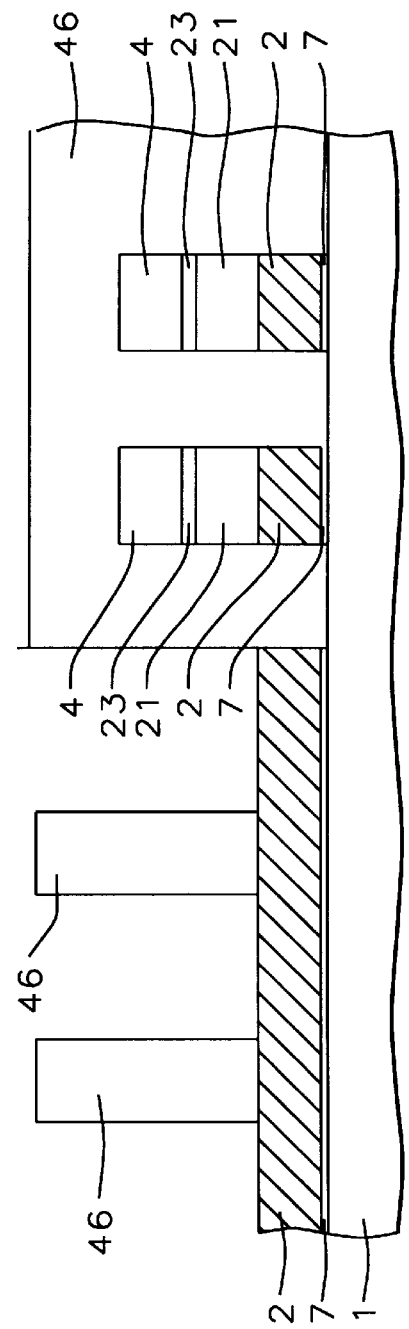
FIG. 3
FIG. 4

INTEGRATION OF SAC AND SALICIDE PROCESSES BY COMBINING HARD MASK AND POLY DEFINITION

FIELD OF THE INVENTION

The invention relates to the general field of integrated circuits with particular reference to logic and memory areas and contacts made thereto.

BACKGROUND OF THE INVENTION

As the dimensions within integrated circuits have grown ever smaller, solutions have had to be found to problems relating to misalignment of successive mask patterns relative to one another during processing. Thus, source and drain regions might not line up correctly relative to the gate, deposited contacts might not line up perfectly inside contact holes, and connections that were physically close together but had to be electrically isolated from one another might develop short circuits between them.

To overcome these problems, a variety of ingenious techniques have been introduced into the integrated circuit art. For example, alignment of source and drain relative to the gate was achieved by using the gate as a mask during ion implantation. The SALICIDE (self-aligned silicide) process took advantge of the fact that certain metals such as titanium or cobalt react when heated in contact with silicon to form conductive silicides but do not react with silicon oxide. Thus, oxide spacers on the vertical walls of the gate pedestal could be used to provide the necessary small, but well controlled, separation between the source and drain contacts and the gate contact.

Although the SALICIDE method made possible significant reductions in device size, as devices shrank even further shorting between the gate and the source/drain began to be a problem and an alternative approach had to be developed. This is the so-called SAC (self-aligned contact) method in which an anisotropic etch is used to form a contact hole that passes through the inter-poly oxide down to the source/drain surface. Perfect alignment of this contact hole relative to the source/drain is not needed since the spacers prevent uncovering of the vertical walls of the gate pedestal. Since etch-through of the spacers at their top (where they are very thin) cannot be avoided, the polysilicon gate pedestal is covered by a layer of silicon nitride (known as a hard mask) and the spacers formed so as to extend from the top of the hard mask to the bottom of the gate pedestal. During contact hole formation a certain amount of the hard mask material does get removed but sufficient remains so that when conductive material is deposited in the contact hole it does not short to the gate pedestal.

It has been the general practice to use the SALICIDE method for logic circuits because it made possible higher circuit performance and the SAC method for memory circuits because it allowed the cell size of the memory unit to be reduced. As long as logic and memory were on separate chips each process could be used without concern for its effect on the other. As part of the next major development in integrated circuits it has become necessary to place logic and memory circuits on the same chip. This avoids the delay introduced by off-chip drivers each time logic and memory communicate with one another. Thus, a process that allows the integration, at reasonable cost, of both the SAC and SALICIDE methods on a single chip is clearly needed. This is the subject matter of the present invention.

While there are many references in the prior art to both processes, none of these, to our knowledge, addresses the specific problem of integrating these different contacting methods for use on a single chip in both memory and logic circuits. Among the references that we found to be of interest we include Fang et al. (U.S. Pat. No. 5,668,035 September 1997) who teach formation of a memory chip with embedded logic but the problem of making optimum (and therefore different) contacts to the two areas is not addressed. Bashir et al. (U.S. Pat. No. 5,397,722 March 1995 ) teach a method for self-alignment in which silicon nitride spacers are formed on the contacting poly layer. The remaining poly is then oxidized following which the silicon nitride is removed and the now unprotected underlying poly is etched away. Yoo (U.S. Pat. No. 5,573,980 November 1996) shows how contact resistance may be reduced by depositing a thin layer of polysilicon prior to silicidation.

Lin (U.S. Pat. No. 5,668,065 September 1997) describe a process for simultaneously forming a self aligned contact, a local interconnect, and a self-aligned silicide in a semiconductor device. No distinction is drawn between logic and memory areas and use is made of a layer of amorphous silicon to allow selective placement of the SAC and the SALICIDE contacts. Matthews (U.S. Pat. No. 5,134,083 July 1992) teaches the use of self-aligned interconnects in BICMOS circuits.

SUMMARY OF THE INVENTION

It has been an object of the present invention to provide a method and structure in which two different contacting methods, namely SALICIDE and SAC, have been selectively applied to logic and memory areas, respectively, said areas being located on the same chip.

A further object of the present invention has been that said method be fully compatible with existing methods currently used to implement the SALICIDE and SAC processes separately.

These objects have been achieved by first depositing the various layers needed by the gate pedestals in both the logic and the memory areas and then forming the two sets of gate pedestals in separate steps. Gates located in the logic area are formed only from polysilicon while those located in the memory areas also have an overlay of tungsten silicide topped by a hard mask of silicon nitride. With the two sets of gates in place, source/drain regions are formed in the usual way. This includes growing of silicon nitride spacers on the vertical sides of the pedestals. The pedestals in the memory area are much longer than those in the logic area since they extend all the way to the top of the hard masks. The pedestals, on the memory side only, are given a protective coating of oxide (RPO). This allows the SALICIDE process to be selectively applied to only the logic side. Then, while the logic side is protected, the SAC process is applied to the memory side. This process is self-aligning. The long spacers define the contact holes and the hard masks allow oversize openings to be etched without the danger of shorting through to the pedestals.

BRIEF DESCRIPTION OF THE DRAWINGS

FIG. 1 illustrates the starting point for the disclosed process. A silicon wafer is divided into logic and memory areas and layers from which the gates will be formed are deposited.

FIG. 2 shows how additional layers of tungsten silicide and silicon nitride are added for use in forming the gates in the memory area.

FIG. 3 illustrates the photoresist masking that is used to define the gate pedestals in the memory area.

FIG. 4 illustrates the photoresist masking that is used to define the gate pedestals in the logic area.

DESCRIPTION OF THE PREFERRED EMBODIMENTS

Figure 5:
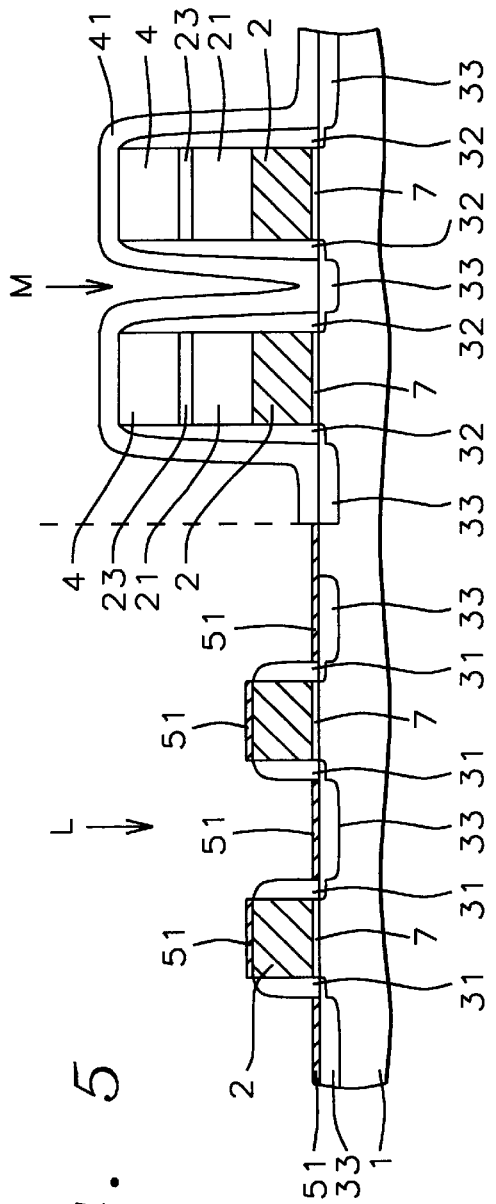
FIG. 5 illustrates how the SALICIDE process was selectively applied to only the logic side.

The process that we describe below is suitable for an integrated circuit that has both logic and memory areas. In the logic areas contact to source/drain is made using the SALICIDE method while in the memory area contact is made by the SAC method.

The process, as claimed, starts with a P type silicon wafer since the intent is to end up with N-channel devices, but it will be understood by those skilled in the art that P-channel devices could equally well have been made using this general approach.

Referring to FIG. 1, the first step is to deposit a layer of gate oxide 7 on the surface of wafer 1. The arrows L and M refer to logic and memory areas respectively. Layer 7 is deposited to a thickness that is between about 30 and 100 Angstroms. Then, layer 2 of polysilicon is deposited followed by layer 3 of silicon oxide. The polysilicon layer is between about 1,000 and 3,000 Angstroms thick and the silicon oxide layer is between about 100 and 500 Angstroms thick. The wafer is then coated with a layer of photoresist 6 which is patterned to protect only the logic area.

Referring now to FIG. 2, silicon oxide layer 3 is selectively removed from the memory area followed by the removal of photoresist layer 6. Layer 21 of tungsten silicide, layer 23 of silicon oxide, and layer 4 of silicon nitride are then deposited in succession. Layer 21 of tungsten silicide is deposited by using chemical vapor deposition (CVD) to a thickness between about 1,000 and 2,000 Angstroms. Its purpose is to reduce the series resistance of the gate in the finished structure. Layer 23 of silicon oxide is deposited to a thickness between about 100 and 500 Angstroms. Its purpose is relieve stress in the next layer which is silicon nitride layer 4. This is deposited to a thickness between about 1,500 and 2,500 Angstroms. It will serve as a hard mask to define the gate pedestal and will also prevent shorting by the SAC contact. A layer of photoresist 26 is now applied to provide protection for the memory area.

Referring now to FIG. 3, in the logic area only, silicon nitride layer 4, silicon oxide layers 3 and 23, and tungsten silicide layer 21 are removed. Note that layer 3 was needed as a temporary etch stop to prevent unintended etching of the polysilicon while the tungsten silicide was etched. Next, a layer of photoresist is applied over the full surface and patterned so that it protects the logic area (layer 36) as well as defining the shapes and positions of the gates (layer 36a) in the memory area.

Moving on to FIG. 4, gate pedestals (comprising layers 7, 2, 21, 23, and 4) can be seen to have been formed. This was done in two steps. First silicon nitride layer 4 was etched, thereby forming the hard mask which was used in turn to define the etching of the remaining underlying layers. This was effected using a mixture of hydrogen bromide and chlorine gases for between about 2 and 5 minutes at a temperature between about 30 and 80° C. Then, layer 46 of photoresist was applied and patterned so as to protect the memory areas and to define the shape and positions of the gate pedestals in the logic areas.

In FIG. 5 gate pedestals can be seen to have been formed in the logic area from layer 2 of polysilicon. Then, source/drain regions 33 were formed using the standard Low Density Drain (LDD) process. As part of the latter, silicon nitride spacers were grown on the vertical walls of the pedestals in both the logic and the memory areas. As seen, spacers 31 in the logic area are of the standard size, extending from the surface of wafer 1 to the top of the polysilcon gate pedestal. Spacers 32 (in the memory area), on the other hand, extend from the wafer surface to the top of the hard mask. Note that silicon nitride, rather than the more conventional silicon oxide, spacers were used because silicon nitride is not attacked by the SAC oxide etch during the formation of the SAC structure.

Continuing our reference to FIG. 5, the next step was to deposit layer 41 of resist protecting oxide (RPO) on the wafer to a thickness between about 200 and 500 Angstroms. The RPO 41 was then selectively removed from the logic area, leaving RPO 41 in place only in the memory area, and the standard SALICIDE process was applied to the wafer. First, a layer of a silicide forming metal such as titanium or cobalt was deposited over the entire wafer to a thickness between about 300 and 500 Angstroms. Our preferred method for depositing the metal has been RF sputtering but similar methods, such as CVD, could also have been used.

The wafer was then given a rapid thermal anneal (RTA), typically between about 20 and 40 seconds at between about 700 and 750° C. This has the effect of causing the deposited metal to be converted to its silicide wherever it is in direct contact with silicon. A selective etchant such as hydrogen peroxide was then used to remove all unreacted metal, i.e. all metal that was in contact with silicon oxide rather than silicon, giving the structure shown in FIG. 5 where the silicide regions have been designated as 51. Note that in this manner the SALICIDE process has been limited to the logic area.

Figure 6:
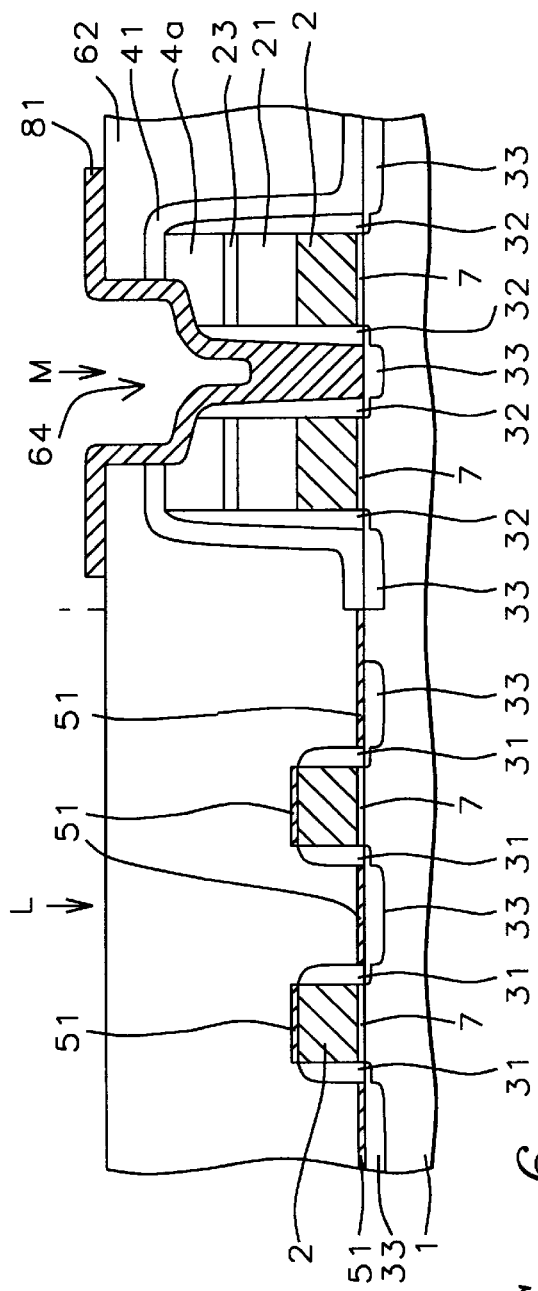
FIG. 6 shows the finished structure, including a layer of IPO with contacts made selectively in the memory area using the SAC process.

Referring now to FIG. 6, following a second RTA of between about 10 and 40 seconds at between about 800 and 900° C., for the purpose of bringing about a phase transformation of the silicide to an allotrope having lower resistivity, a layer of inter poly oxide (IPO) 62 was deposited over the wafer to a thickness between about 5,000 and 7,000 Angstroms, which is sufficient to fully cover both the logic and the memory areas. This was followed by the etching of openings 64 which are located directly above wherever it is intended that contact to source/drain areas in the memory area will be made. Etching of IPO layer 62 was effected using carbon tetrafluoride and/or methane trifluoride at a temperature between about 0 and 30° C. for between about 1 and 2 minutes. Precise alignment of opening 64 was not needed because spacers 32 defined the exact shape and position of the contact holes (hence the term self-aligned contact or SAC). Even if some portion of hard mask 4 is etched away as a side effect of the hole opening process, the partially eroded hard mask (designated as 4a in FIG. 7) still covers tungsten silicide layer 21 so shorting between the latter and contacting layer 81 will not occur. Our preferred material for layer 81 has been polysilicon but other conductive materials such as tungsten silicide or polysilicon could also have been used. The thickness of layer 81 is between about 1,000 and 4,000 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of combining hard mask and poly definition when forming contacts in an integrated circuit wafer that contains logic and memory areas, comprising the sequential steps of:

providing a P type silicon wafer having a top surface;

forming a layer of gate oxide on said surface;

depositing on the wafer successive layers of first polysilicon and first silicon oxide;

selectively removing said first silicon oxide layer from the memory area;

depositing on the wafer successive layers of tungsten silicide, second silicon oxide, and silicon nitride;

selectively removing the silicon nitride, second silicon oxide, tungsten silicide, and first oxide layers from the logic area;

in the memory area only, patterning and etching the silicon nitride, second oxide, tungsten silicide, first polysilicon, and gate oxide layers to form memory gate pedestals having vertical walls;

in the logic area only, patterning and etching the first polysilicon and gate oxide layers to form logic gate pedestals having vertical walls;

forming N type source and drain regions adjacent to said vertical walls by means of ion implantation into said adjacent regions together with the formation of silicon nitride spacers on said vertical walls; selectively depositing a layer of resist protecting oxide on the memory area;

depositing a layer of a silicide forming metal on the wafer;

subjecting the wafer to a first rapid thermal anneal whereby the metal reacts to form a layer of silicide wherever it is in direct contact with silicon;

removing all unreacted metal thereby forming self-aligned source, gate, and drain contacts in the logic area;

subjecting the wafer to a second rapid thermal anneal;

depositing a layer of inter poly oxide over the wafer sufficient to fully cover both the logic and the memory area;

patterning and etching the inter poly oxide to form contact holes in the memory area;

depositing a second polysilicon layer; and patterning and etching the second polysilicon layer to form connections in said contact holes.

2. The method of claim 1 wherein the gate oxide layer is deposited to a thickness between about 30 and 100 Angstroms.

3. The method of claim 1 wherein said first layer of polysilicon is deposited to a thickness between about 1,000 and 3,000 Angstroms.

4. The method of claim 1 wherein said first layer of silicon oxide is deposited to a thickness between about 100 and 500 Angstroms.

5. The method of claim 1 wherein said layer of tungsten silicide is deposited to a thickness between about 1,000 and 2,000 Angstroms.

6. The method of claim 1 wherein said second layer of silicon oxide is deposited to a thickness between about 100 and 500 Angstroms.

7. The method of claim 1 wherein said layer of silicon nitride is deposited to a thickness between about 1,500 and 2,500 Angstroms.

8. The method of claim 1 wherein said layer of resist protecting oxide is deposited to a thickness between about 100 and 500 Angstroms.

9. The method of claim 1 wherein said layer of silicide forming metal is deposited to a thickness between about 300 and 500 Angstroms.

10. The method of claim 1 wherein said layer of silicide forming metal is titanium or cobalt.

11. The method of claim 1 wherein said first rapid thermal anneal further comprises heating the wafer to a temperature between about 700 and 750° C. for between about 20 and 40 seconds.

12. The method of claim 1 wherein said second rapid thermal anneal further comprises heating the wafer to a temperature between about 800 and 900° C. for between about 10 and 40 seconds.

13. The method of claim 1 wherein said layer of inter poly oxide is deposited to a thickness between about 5,000 and 7,000 Angstroms.

14. The method of claim 1 wherein the step of patterning and etching the inter poly oxide to form contact holes in the memory area further comprises etching in carbon tetrafluoride and methane trifluoride at a temperature between about 0 and 30° C. for between about 1 and 2 minutes.

15. The method of claim 1 wherein the second layer of polysilicon is deposited to a thickness between about 1,000 and 4,000 Angstroms.

* * * * *